US006271947B1

United States Patent
Iannone et al.

(10) Patent No.: US 6,271,947 B1
(45) Date of Patent: Aug. 7, 2001

(54) SIMULTANEOUS WAVELENGTH-DIVISION MULTIPLEXING AND BROADCAST TRANSMISSION SYSTEM

(75) Inventors: Patrick P. Iannone, Redbank; Kenneth C. Reichmann, Hamilton Square, both of NJ (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 09/695,256

(22) Filed: Oct. 25, 2000

Related U.S. Application Data

(63) Continuation of application No. 08/918,931, filed on Aug. 25, 1997, now Pat. No. 6,147,784.
(60) Provisional application No. 60/024,634, filed on Aug. 27, 1996.

(51) Int. Cl.[7] .................................................. H04J 14/02
(52) U.S. Cl. ............................ 359/124; 359/127; 359/125
(58) Field of Search ..................................... 359/124, 130, 359/132, 180, 181, 349; 385/24; 372/23

(56) References Cited

U.S. PATENT DOCUMENTS

| 5,373,517 | 12/1994 | Dragone et al. ................... 372/20 |
| 5,444,725 | 8/1995 | Zirnbibl ............................... 372/20 |
| 5,541,757 | 7/1996 | Fuse et al. ......................... 359/125 |
| 5,631,758 | * 5/1997 | Knox et al. ....................... 359/127 |
| 5,861,965 | * 1/1999 | Koren et al. ...................... 359/123 |
| 5,915,052 | * 6/1999 | Ball ..................................... 385/24 |
| 6,072,612 | * 6/2000 | Liou et al. ........................ 359/123 |
| 6,185,024 | * 2/2001 | Johnson et al. .................. 359/133 |

FOREIGN PATENT DOCUMENTS 0 690 591 A1   1/1996   (EP) .

OTHER PUBLICATIONS

M. Zirngibl et al, 12frequency WDM laser based on a transmissive waveguide grating router, Electronics Letters, Apr. 28, 1994, vol. 30 No. 9, pp. 701–702.
M. Zirngibl et al, LARNet, A Local Access Router Network, IEEE Photonics Technology Letters, vol. 7, No. 2, Feb. 1995, pp. 215–217.
C. Dragone, An N × N Optical Multiplexer Using a Planar Arrangement of Two Star Couplers, IEEE Photonics Technology Letters, vol. 3, No. 9, Sep. 1991, pp. 812–815.
R. C. Menendez et al., Passive Fibre–Loop Architecture Providing Both Switched and Broadcast Transport, Electronic Letters, Mar. 1, 1990, vol. 26, No. 5, pp. 273–274.
P. J. Smith, D. W.Faulkner and G.R. Hill, "Evolution Scenarios for Optical Telecommunication Networks Using Multiwavelength Transmission," *Proceedings of the IEEE*, vol. 81, No. 11, Nov. 1993, pp. 1580–1586.
P. P. Iannone, K. C. Reichmann, C. R. Doerr, M. Zirngibl and L. Iannone, "Simultaneous WDM and Broadcast Transmission Using a Single Multiwavelength Waveguide–Grating–Router Laser," *IEEE Photonics Technology Letters*, vol. 8, No. 10, Oct. 1996, pp. 1397–1399.

(List continued on next page.)

*Primary Examiner*—Leslie Pascal
*Assistant Examiner*—Dalzid Singh

(57) ABSTRACT

A system for simultaneously transmitting multifrequency signals including a laser light source having a shared gain section and an addressable gain section. A first group of signals modulating the addressable gain section of the laser produces a plurality of wavelength division multiplexed channels. The second group of signals modulates the shared gain section of the laser such that each of the multiplexed channels is modulated with the signals from the second group.

15 Claims, 3 Drawing Sheets

OTHER PUBLICATIONS

P. P. Iannone et al Broadcast Digital Video Delivered Over WDM Passive Optical Networks, *IEEE Photonics Technology Letters,* vol. 8, No. 7, Jul. 1996, 930–932.

C. R. Doerr et al., Elimination of Signal Distortion and Crosstalk from Carrier Density Changes in the Shared Semiconductor Amplifier of Multifrequency Signal Sources, IEEE Photonics Technology Letters, vol. 7, No. 10, Oct. 1995, pp. 1131–1133.

K. C. Reichmann et al, Broadcast Digital Video as a Low-Cost Overlay to Baseband Digital–Switched Services on a PON, OFC '96 Technical Digest, pp 144–146.

* cited by examiner

SIMULTANEOUS WAVELENGTH-DIVISION MULTIPLEXING AND BROADCAST TRANSMISSION SYSTEM

This application is a continuation of U.S. patent application Ser. No. 08/918,931, filed Aug. 25, 1997 now U.S. Pat. No. 6,147,784.

RELATED APPLICATION

This application claims the benefit of U.S. Provisional Application No. 60/024,634, filed Aug. 27, 1996.

FIELD OF INVENTION

The present invention generally relates to optical communication systems and more particularly to systems that utilize a laser light source for simultaneously transmitting a plurality of multifrequency signals.

BACKGROUND

Optical communication systems are used to transmit information signals over optical fibers or waveguides. In order to increase the capacity of these systems, wavelength division multiplexing (WDM) is used to transmit multiple signals at different wavelengths over a single waveguide. A waveguide grating router laser (WGRL) such as disclosed in U.S. Pat. No. 5,373,517 entitled "Rapidly Tunable Integrated Laser" issued to Dragone et al., can be used as a multiple wavelength source for high performance WDM local access networks. The WGRL can simultaneously transmit N equally spaced WDM channels, each modulated with an information signal. The WGRL includes N separately addressable gain sections and an integral 1×N waveguide grating router (WGR) preferably integrated on a semiconductor wafer.

When A WDM local access network includes feeder fiber(s) from a central office to a remote node consisting of a waveguide-grating router (WGR), which is in turn connected to remote terminals (or optical network units) via multiple distribution fibers, the local access network is referred to as a WGR-based WDM passive optical network. By matching the wavelengths of the WGRL transmitter, located at the central office, to the WGR at the remote node, distinct broadband signals modulating each wavelength can be transmitted to each of N remote terminals.

WGR-based WDM passive optical networks are thus well suited to transmit distinct broadband signals to each of a multiplicity of terminals or subscribers (thereby establishing broadband point-to-point connections). However these networks are not optimized for the simultaneous transmission of broadcast signals, such as video, to all subscribers. A passive splitter based network can be used in addition to a WGR-based WDM passive optical network to transmit these broadcast signals. However, a drawback associated with this approach is that it requires a separate network to transmit the broadcast signals thereby requiring increased cost and complexity.

Another approach is to take advantage of spectral slicing through the WGR at the remote node to provide broadcast video signals without altering the outside fiber plant. Spectral slicing refers to a technique known in the art, whereby a light source (such as an LED), having a broad spectral output, is employed in conjunction with a WDM demultiplexer (or WGR demultiplexer) to generate a multiplicity of spectral bands. Thus, in the case of a WGR-based passive optical network, a single broadband source is modulated with broadcast information. The WGR at the remote node slices this broad spectrum and directs an equal fraction of the modulated optical spectrum to each subscriber. A disadvantage associated with this approach is that it requires an additional light source at the central office which increases the optical bandwidth of the system as well as requiring coarse WDM couplers at both the central office and at each subscriber's optical network unit.

Accordingly, there is a need for an optical network which simultaneously delivers both broadband and broadcast signals without requiring an additional overlayed network or an additional light source.

SUMMARY OF THE INVENTION

The system in accordance with one embodiment in accordance with the present invention meets these needs and avoids the disadvantages and drawbacks of prior systems by providing a system for simultaneously transmitting multifrequency signals where a first group of signals modulate a light source to produce a plurality of information bearing wavelength division multiplexed channels. A second signal modulates the multiplexed channels.

In another embodiment in accordance with the invention, a system is provided for simultaneously transmitting multifrequency signals including a light source having a shared gain section and an addressable gain section. A first group of signals modulating the addressable gain section of the laser produces a plurality of wavelength division multiplexed channels. A second group of signals modulates the shared gain section of the laser such that each of the multiplexed channels is modulated with the second signal group.

DETAILED DESCRIPTION

Figure 1:
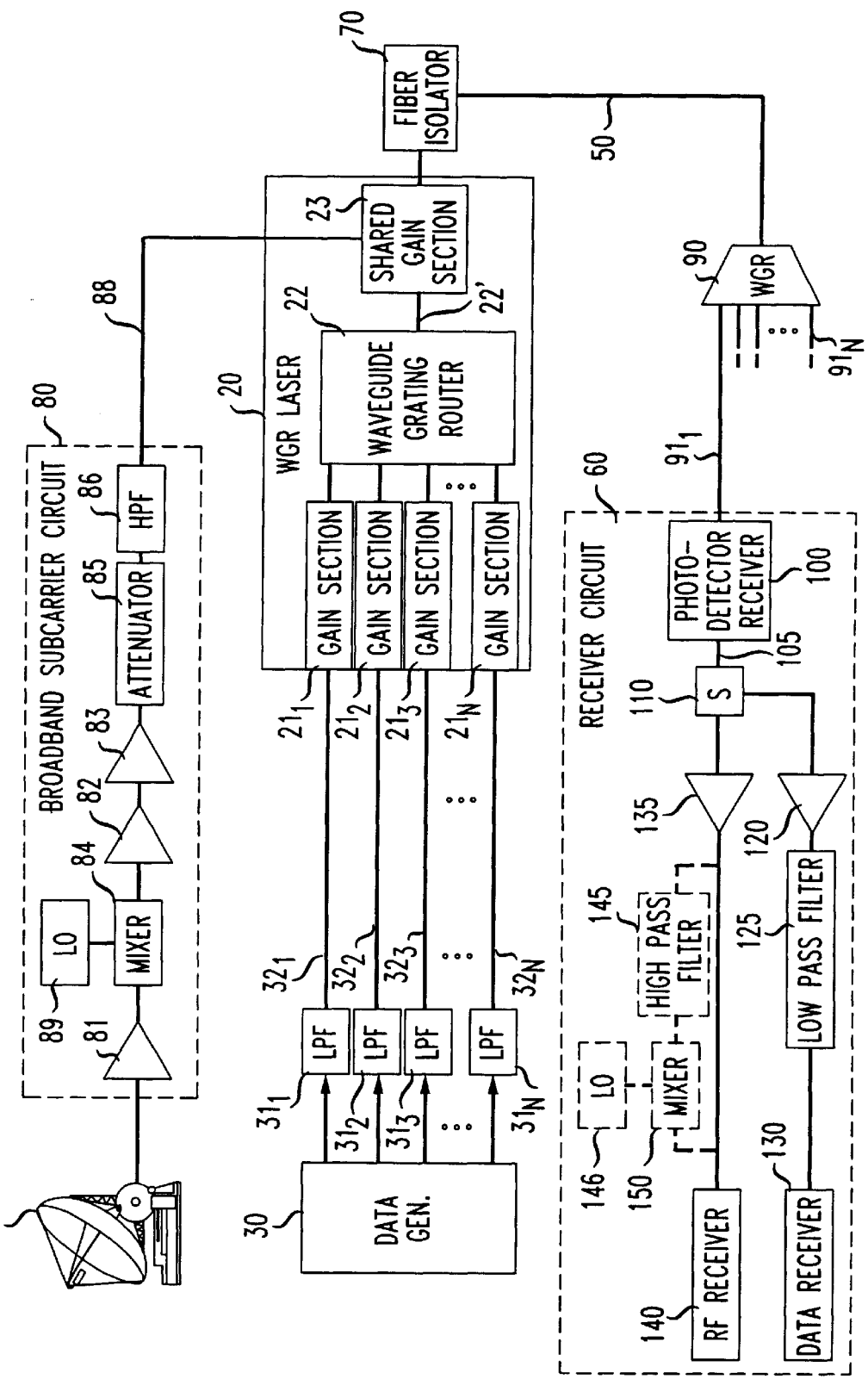
FIG. 1 is a block diagram of a system in accordance with a first embodiment of the present invention.

FIG. 1 is a simplified block diagram of the system 10 in accordance with one embodiment of the present invention. The system 10 is adapted to combining broadband and baseband signals. The baseband signals modulate addressable gain sections of a waveguide-grating router laser (WGRL) and broadband signals modulate a shared gain section of the WGRL so as to combine the broadband signals with each modulated baseband channel. A waveguide grating router demultiplexes the received channels and a receiver circuit splits the baseband and broadband signals. In this manner, system 10 can simultaneously transmit N WDM channels, each channel modulated with a broadband signal.

Generally, FIG. 1 illustrates a waveguide grating router laser 20, a data generator or like baseband signal source 30, a broadband signal source 40, a waveguide or light transmission medium 50, a waveguide-grating router 90 and receiver circuits 60. The WGRL 20 includes separately addressable gain sections $21_1, 21_2, 21_3 \ldots 21_N$, where N is equal to the number of baseband signals received from source 30. Each addressable gain section $21_1, 21_2, 21_3 \ldots 21_N$ is coupled to waveguide grating router 22 which is a routing device operating as a multiplexer/demultiplexer of optical frequencies. The output at 22' of WGR 22 is coupled to a shared gain section 23.

A baseband signal source 30, such as a data generator, produces baseband signals filtered by low pass filters $31_1, 31_2, 31_3, \ldots 31_N$. The baseband signals received from source 30 and lowpass filtered at filters $31_1 \ldots 32_N$, are transmitted over lines $32_1, 32_2, 32_3 \ldots 32_N$ to modulate each of the respective addressable gain sections $21_1 \ldots 21_N$ of WGRL 20 thereby producing N WDM channels. By way of example, the inventors of the present invention utilized four channels of a 1.5 $\mu$m wavelength integrated eight wavelength device having eight separately addressable gain sections, an 8×1 WGR and a fiber-pigtailed output facet. The baseband signals received from source 30 were distinct $2^{23}-1$ pseudo random bit streams (PRBS) at 150 Mb/s. The laser's round-trip frequency was approximately 2.5 GHz. The four addressable gain sections of WGRL 20 used were biased at 30.6 mA, 29.3 mA, 27.4 mA, and 29.1 mA which produced four WDM channels with 200 GHz spacing.

Broadband signals transmitted from source 40 include, for example, digital video signals received from a broadcast system. Depending on the signal transmission from source 40, these signals may be in digital form and may contain several video and audio channels occupying a predetermined bandwidth. For example, the broadband signals may be 16 quadrature phase shift keying (QPSK) subcarriers containing 79 MPEG video channels and 29 audio channels which occupy a 500 MHZ band which are downconverted to the 350–850 MHZ range in order to fit within the bandwidth of the transmitter used.

A broadband subcarrier circuit 80 is used, if needed, to adjust the amplitude of the received broadband signals. Depending on the broadband signal source 40 and the signals transmitted therefrom, circuit 80 can include: cascaded amplifiers 81, 82, and 83 for maintaining, within acceptable levels, the signal to noise ratio of the broadband signals; a local oscillator 89 and mixer 84 for downconverting, if necessary, the broadband signals to fit within the bandwidth of WGRL 20; and an attenuator 85 and high pass filter 86. The output of circuit 80 is transmitted over line 88 and modulates shared gain section 23 of WGRL 20. For example, the shared gain section 23 may be biased at 70.4 mA for modulating the broadband signals. In this manner, each of the WDM channels modulated at the addressable gain sections $21_1 \ldots 21_N$ of WGRL 20 are simultaneously modulated with the broadband RF signals from shared gain section 23 of WGRL 20 using a single RF drive circuit.

The WDM channels modulated with the broadband signals are output from WGRL 20 to fiber isolator 70 and transmitted over waveguide medium 50 to a remote node which includes a waveguide-grating router 90 for optically demultiplexing the transmitted WDM channels. Temperature tuning of WGRL 20 may be required to align the channels of WGR 90 and WGRL 20. Distribution fibers $91_1 \ldots 91_N$ coupled to WGR 90 route the WDM channels according to wavelengths to each of N receivers 60. Each circuit 60 includes a photodetector receiver 100, such as an avalanche photodiode receiver, which is coupled to one of the outputs $91_1 \ldots 91_N$ of the waveguide grating router 90, to convert the optically received signal into an electrical signal. The output 105 of receiver circuit 100 is coupled to splitter 110 which splits the received electrical signals permitting separate filtering of the baseband point-to-point and the broadband broadcast portions of the electrical spectrum into its baseband and broadband signals. The baseband signals are transmitted to amplifier 120 which is coupled to splitter 110. Low pass filter 125 is coupled, at its input, to amplifier 120 and at its output to data receiver 130 which receives the transmitted baseband signals. The broadband signals split at splitter 110 are amplified by amplifier 135 and transmitted to RF receiver 140. Alternatively, a high pass filter 145, shown in broken lines, connected in series with mixer 150 and local oscillator 146, also shown in broken lines, can be disposed between amplifier 135 and RF receiver 140 depending upon the frequency bandwidth of the broadcast signals received.

Figure 2:
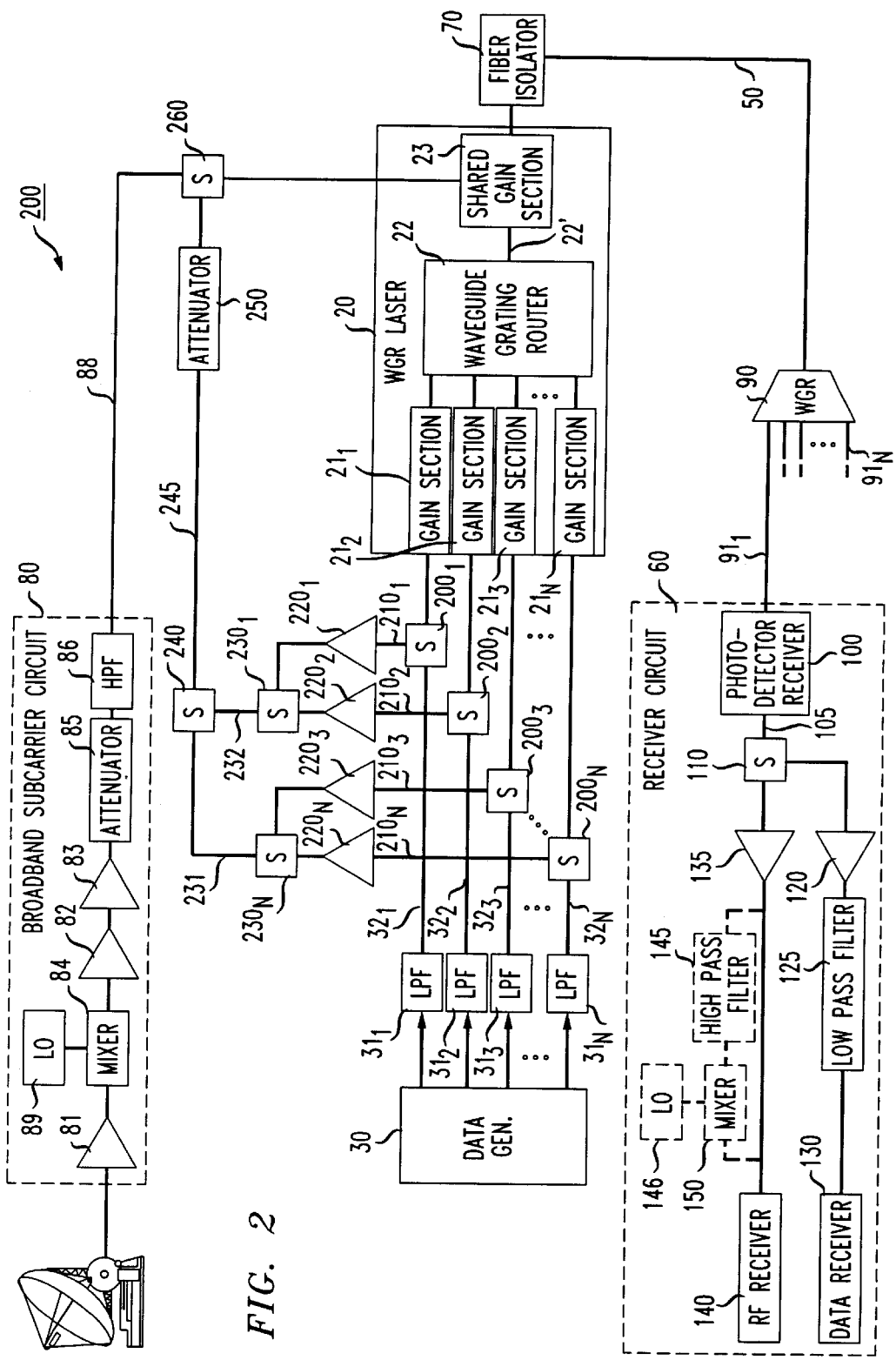
FIG. 2 is a block diagram of a system in accordance with a second embodiment of the present invention, including a feed forward circuit.

FIG. 2 illustrates a feed forward circuit scheme as disclosed in C. R. Doerr, et al., "Elimination of Signal Distortion and Crosstalk from Carrier Density Changes in the Shared Semiconductor Amplifier of Multifrequency Signal Sources," IEEE Phot. Technology Lett., Vol. 7, pp. 1131–1133, 1995. This scheme employed with the system of FIG. 1 is used to eliminate or reduce crosstalk due to carrier density fluctuations in the shared gain section 23 of WGRL 20. Baseband signals received from source 30 are filtered by low pass filters $31_1, 31_2, 31_3 \ldots 31_N$ and transmitted over lines $32_1, 32_2, 32_3 \ldots 32_N$ to splitters $200_1, 200_2, 200_3, \ldots 200_N$. The baseband signals are split with one portion directly modulating the addressable gain sections $21_1 \ldots 21_N$ of WGRL 20 and the other portion transmitted over lines $210_1, 210_2 \ldots 210_N$. The signals are amplified by amplifiers $220_1 \ldots 220_N$ and combined with similar portions of each of the remaining modulation signals in a feed forward scheme by splitters $230_1 \ldots 230_N$. For example, a portion of the broadband signals transmitted on lines $210_N$ and $210_3$ amplified by amplifiers $220_N$ and $220_3$ respectively and combined at splitter $230_N$ and outputted onto line 231; the broadband signals transmitted on lines $210_1$ and $210_2$ are combined at splitter $230_1$ and outputted onto line 232. Similarly, the outputs on lines 231 and 232 from splitters $230_1$ and $230_N$ respectively, are combined at splitter 240 and transmitted over line 245 to attenuator 250. The number of splitters and baseband signals to be combined is dependent on N which is the number of baseband signals received from source 30.

Splitter 260 combines the output signal from attenuator 250 with the broadband signals transmitted over line 88 and outputs the combined signals which modulate shared gain section 23 of WGRL 20. The WDM channels modulated with the broadband signals are output from WGRL 20 to a fiber isolator 70 and transmitted over a waveguide medium 50 to a WGR 90, and then via distribution fibers $91_1 \ldots 91_N$ to N receiver circuits 60 as described with reference to FIG. 1.

Figure 3:
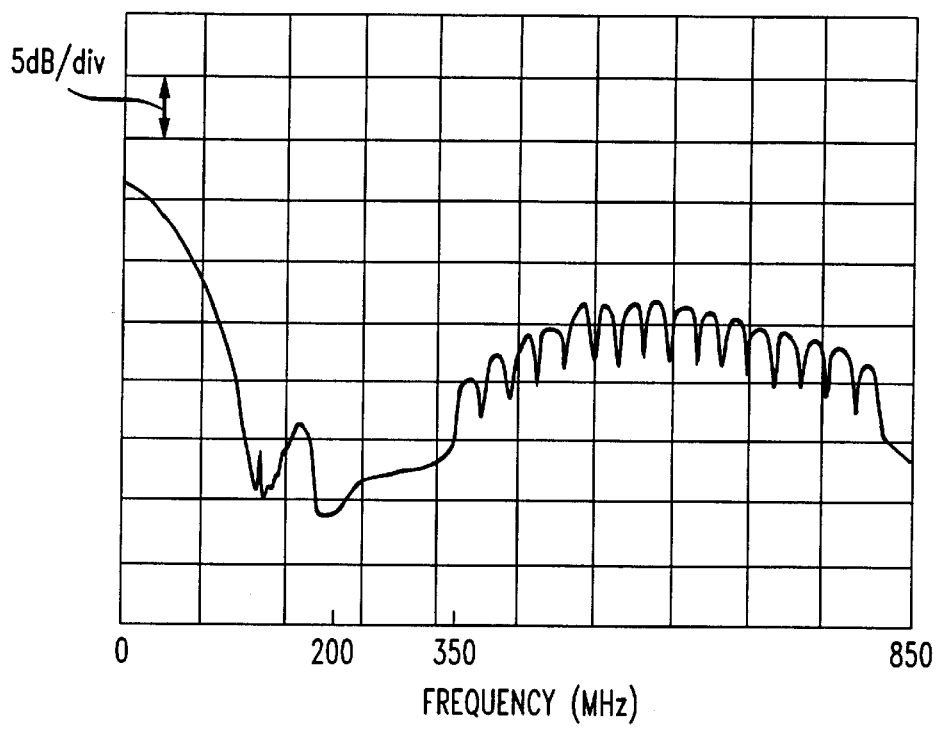
FIG. 3 is an exemplary RF spectrum graph recorded at the output of the receiver portion of the system.

Turning now to FIG. 3, an exemplary graph of the RF spectrum recorded at output 105 of receiver circuit 100 using the system described in FIGS. 1 and 2 illustrates that 150 Mb/s baseband data occupies the frequency band from DC to approximately 200 MHZ and the video subcarriers occupy the band from 350 MHZ to 850 MHZ. This exemplary measurement was taken using four addressable gain sections of a 1.5 $\mu$m wavelength integrated eight wavelength WGRL 20 biased at 30.6 mA, 29.3 mA, 27.4 mA, and 29.1 mA respectively which produced four WDM channels with 200 GHz spacing. The baseband signals used from source 30 were $2^{23}-1$ pseudo random bit streams (PRBS) at 150 Mb/s. This graph shows that multiple information bearing WDM channels, each channel simultaneously modulated with broadband broadcast signals from source 40, can be successfully transmitted using a multiwavelength waveguide-grating router laser and received by a receiver circuit 60 after being demodulated by WGR 90.

Figure 4:
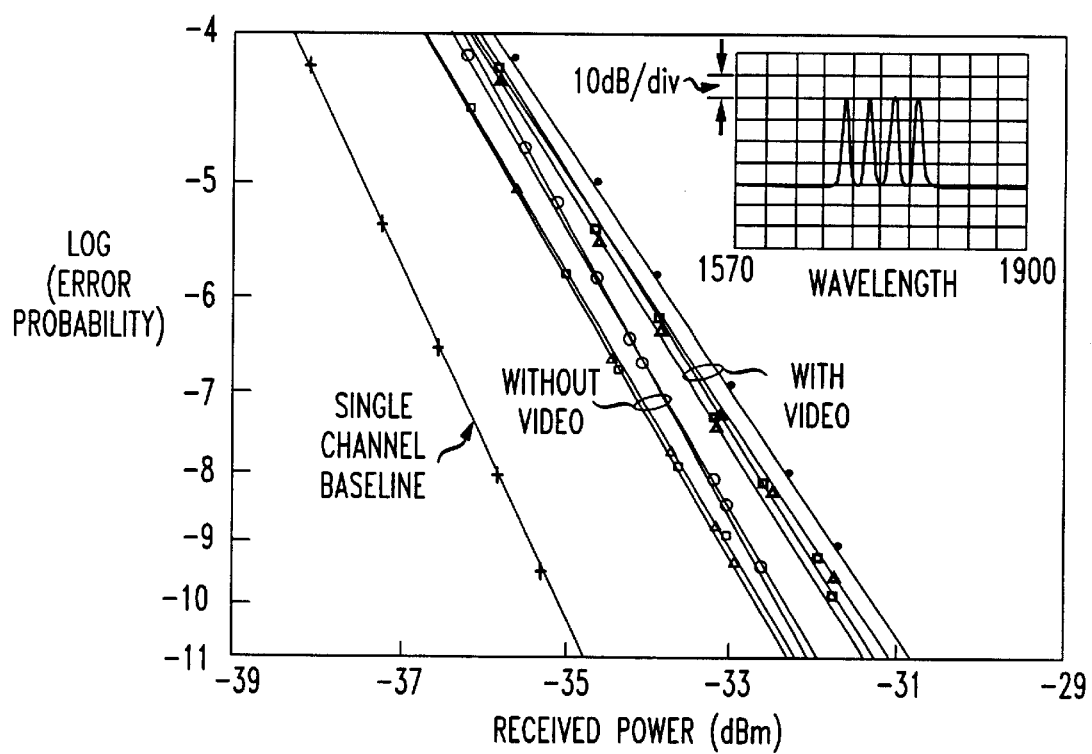
FIG. 4 is an exemplary bit-error-rate graph of transmitted WDM channels with and without modulation of the broadcast video signals.

FIG. 4 illustrates the bit-error rate (BER) performance of the four WDM channels referenced in FIGS. 2 and 3 both with and without the broadband signals. A BER curve is a standard measure of the performance of an optical communication system in which the probability of receiving an error is plotted as a function of received optical power. The BER data taken without the broadband signals are represented by open symbols, while data taken with the broadband signals are represented by closed symbols. Prior to measuring the exemplary BER performance of the system, the optical modulation depth of both the baseband and broadband signals were adjusted such that the received optical power in each WDM channel required for a $10^{-9}$ BER was roughly equal to the received optical power at which a noticeable degradation of video picture quality was observed. The baseband optical modulation depth for all four WDM channels was set in the range from 55–58%. The broadband optical modulation depth was set such that the received optical power required for excellent picture quality was −32 dBm for all four WDM channels. This operation point was chosen to ensure that one service did not unduly suffer at the expense of the other. Baseband network performance was then evaluated by measuring the BER for each WDM channel, both with and without the broadband signals. The single-channel baseline curve shows the output of the photodetector receiver 100 and the −35.5 dBm receiver sensitivity at $10^{-9}$ BER for a single 150 Mb/s channel with 100% modulation depth. The power penalty of 2–3 dB was measured for the four channels without the broadband signals, as expected for a decrease in modulation depth from 100% to 55–58% range. The addition of the broadband signals to the baseband signals resulted in an additional 1 dB of power penalty to each channel. The inset in FIG. 4 is an optical spectrum analyzer trace of the four WDM channels.

The present invention illustrates that a WDM passive optical network with a WGRL located, for example, at a central office and a WGR located, for example, at a remote node, can provide high speed virtual point-to-point connectivity. The present system illustrates that a WGRL can be used as a source to provide both virtual point-to-point baseband connections with a simultaneous broadband service.

What is claimed is:

1. An communication apparatus, comprising:
   a laser comprising a shared gain section and a plurality of addressable gain sections, the addressable gain sections adapted to be coupled to respective data sources; and
   a plurality of feedforward circuits coupled to each of the addressable gain sections and to the shared gain section.

2. The communication apparatus of claim 1, wherein the plurality of feedforward circuits have a layered tree architecture.

3. The layered tree architecture of claim 2, wherein at each layer, input lines from a predecessor layer are coupled at a combiner, the combiners having a unitary output line to a next layer.

4. The communication apparatus of claim 1, further comprising an attenuator coupled therebetween the plurality of feedforward circuits and the shared gain section.

5. The communication apparatus of claim 1, wherein the addressable gain sections include a plurality of amplifiers.

6. The communication apparatus of claim 1, further including a plurality of electrical signal filters coupled to the addressable gain sections.

7. The communication apparatus of claim 6, wherein the electrical signal filters include low pass filters.

8. The communication apparatus of claim 1, wherein the laser is a waveguide grating router laser.

9. The communication apparatus of claim 1, wherein the data sources include baseband signal sources.

10. The communication apparatus of claim 1, wherein the shared gain section is adapted to be coupled to a source.

11. The communication apparatus of claim 10, wherein the source includes a broadband signal source.

12. The communication apparatus of claim 1, further including a wavelength division multiplexing (WDM) demultiplexer coupled to the laser.

13. The communication apparatus of claim 12, wherein the WDM demultiplexer includes a plurality of distribution outputs, each of the outputs coupled to a receiver circuit.

14. The communication apparatus of claim 13, wherein the receiver circuit includes a photodetector circuit.

15. The communication apparatus of claim 1, wherein the laser is tunable to a plurality of separate wavelengths.

\* \* \* \* \*